(12) United States Patent
Thayer et al.

(10) Patent No.: US 8,397,796 B2
(45) Date of Patent: Mar. 19, 2013

(54) POROUS MEDIA COLD PLATE

(75) Inventors: John G. Thayer, Lancaster, PA (US); Kevin L. Wert, Halifax, PA (US); Mark T. North, Lancaster, PA (US); C. Scott Schaeffer, Ephrata, PA (US)

(73) Assignee: Thermal Corp., Wilmington, DE (US)

( * ) Notice: Subject to any disclaimer, the term of this patent is extended or adjusted under 35 U.S.C. 154(b) by 80 days.

(21) Appl. No.: 12/752,910

(22) Filed: Apr. 1, 2010

(65) Prior Publication Data

US 2010/0181056 A1 Jul. 22, 2010

Related U.S. Application Data

(63) Continuation of application No. 11/381,439, filed on May 3, 2006, now Pat. No. 7,690,419, which is a continuation of application No. 10/970,404, filed on Oct. 20, 2004, now Pat. No. 7,044,199.

(60) Provisional application No. 60/512,736, filed on Oct. 20, 2003.

(51) Int. Cl.
*H05K 7/20* (2006.01)

(52) U.S. Cl. ........................ 165/80.4; 165/907; 361/699

(58) Field of Classification Search ........................ None
See application file for complete search history.

(56) References Cited

U.S. PATENT DOCUMENTS

| | | | | |
|---|---|---|---|---|
| 3,817,321 A * | 6/1974 | Von Cube et al. | ....... | 165/104.22 |
| 3,938,587 A | 2/1976 | Vian | | |
| 4,359,872 A * | 11/1982 | Goldowsky | ........................ | 62/6 |
| 4,628,991 A * | 12/1986 | Hsiao et al. | ................... | 165/80.4 |
| 4,730,665 A * | 3/1988 | Cutchaw | ....................... | 165/80.4 |
| 4,884,169 A * | 11/1989 | Cutchaw | ....................... | 361/700 |
| 4,884,630 A * | 12/1989 | Nelson et al. | ................... | 165/170 |
| 4,898,234 A | 2/1990 | McGovern et al. | | |
| 5,070,896 A * | 12/1991 | Warren | ............................ | 137/1 |
| 5,123,982 A * | 6/1992 | Kuzay | ......................... | 156/89.28 |
| 5,125,451 A * | 6/1992 | Matthews | ..................... | 165/80.4 |
| 5,274,920 A | 1/1994 | Matthews | | |
| 5,402,004 A | 3/1995 | Ozmat | | |
| 5,960,861 A | 10/1999 | Price et al. | | |
| 6,016,007 A * | 1/2000 | Sanger et al. | ................. | 257/714 |
| 6,018,616 A | 1/2000 | Schaper | | |
| 6,131,650 A * | 10/2000 | North et al. | .................... | 165/170 |
| 6,169,660 B1 | 1/2001 | Sarraf et al. | | |
| 6,207,894 B1 * | 3/2001 | Reiker | ............................ | 174/503 |
| 6,367,543 B1 | 4/2002 | Calaman et al. | | |
| 6,634,421 B2 | 10/2003 | Ognibene et al. | | |
| 7,161,802 B2 | 1/2007 | Weber et al. | | |
| 7,188,662 B2 | 3/2007 | Brewer et al. | | |
| 2002/0157813 A1* | 10/2002 | Cho et al. | ................. | 165/104.26 |
| 2006/0096738 A1* | 5/2006 | Kang et al. | .................... | 165/80.4 |
| 2007/0034356 A1* | 2/2007 | Kenny et al. | ................. | 165/80.4 |

* cited by examiner

*Primary Examiner* — Allen Flanigan
(74) *Attorney, Agent, or Firm* — Michael Best & Friedrich LLP

(57) ABSTRACT

A heat exchanger for cooling a heat generating device including a base having a recess with a base coolant inlet opening and a base coolant outlet opening. A porous core is positioned within the recess of the base, and has a core coolant inlet opening and a core coolant outlet opening that are arranged in corresponding relation with base coolant inlet opening and a base coolant outlet opening so as to be in fluid communication. A porous gasket is pinched between the porous core and the base.

13 Claims, 10 Drawing Sheets

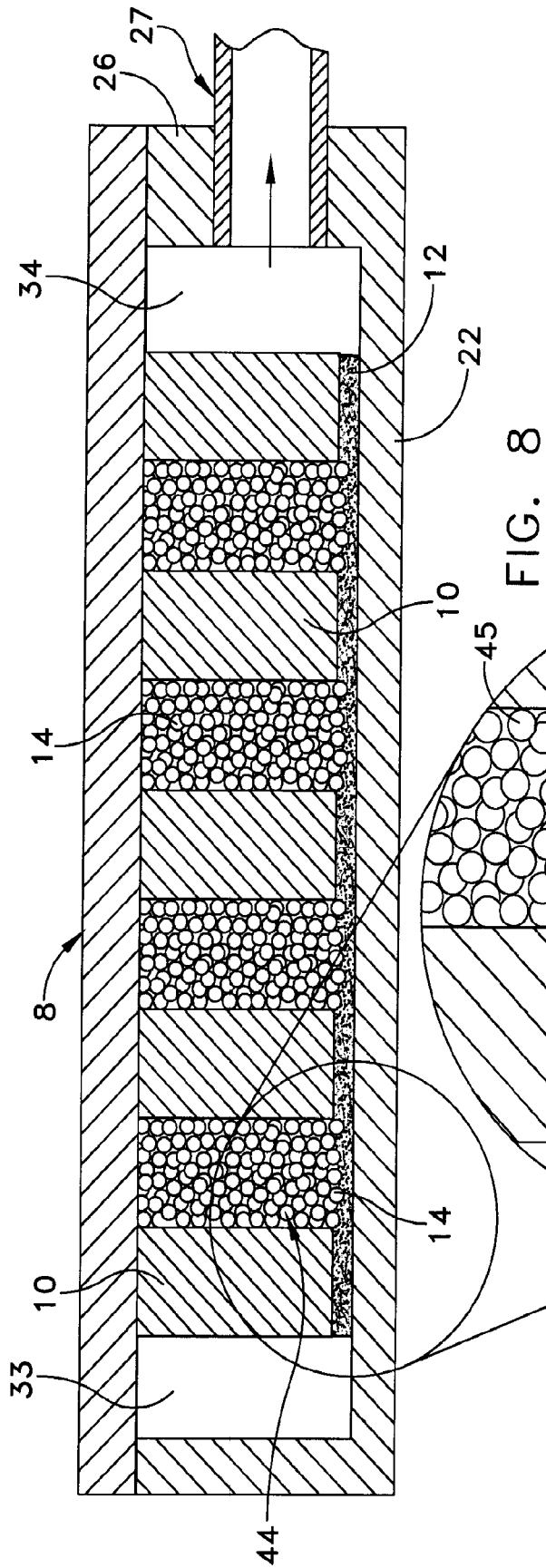
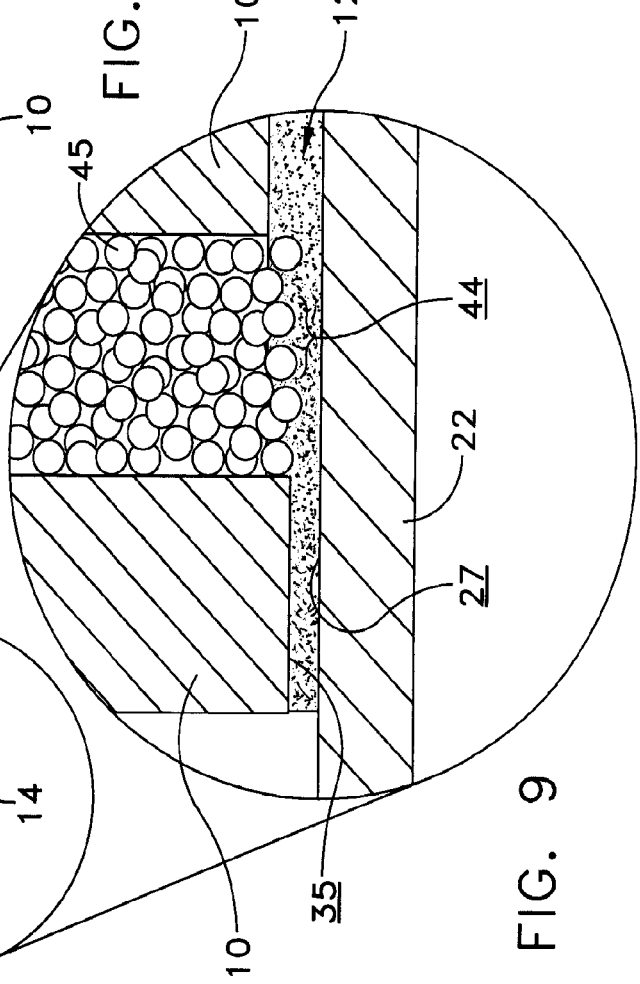
FIG. 8
FIG. 9

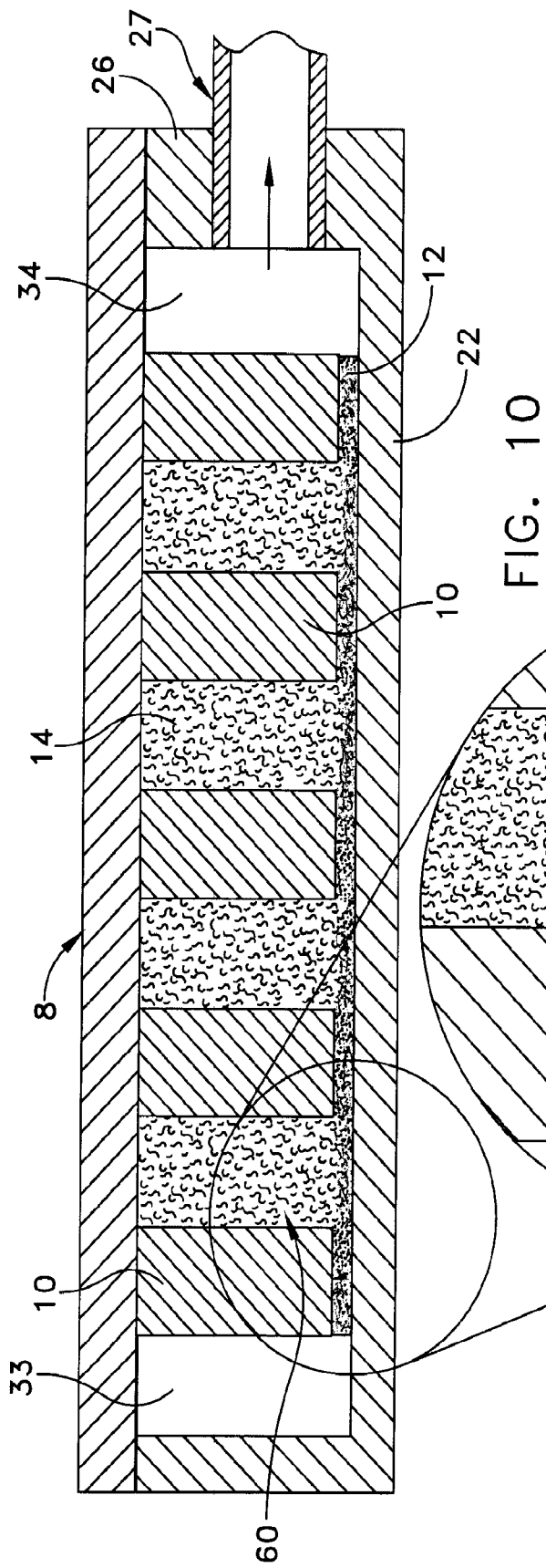
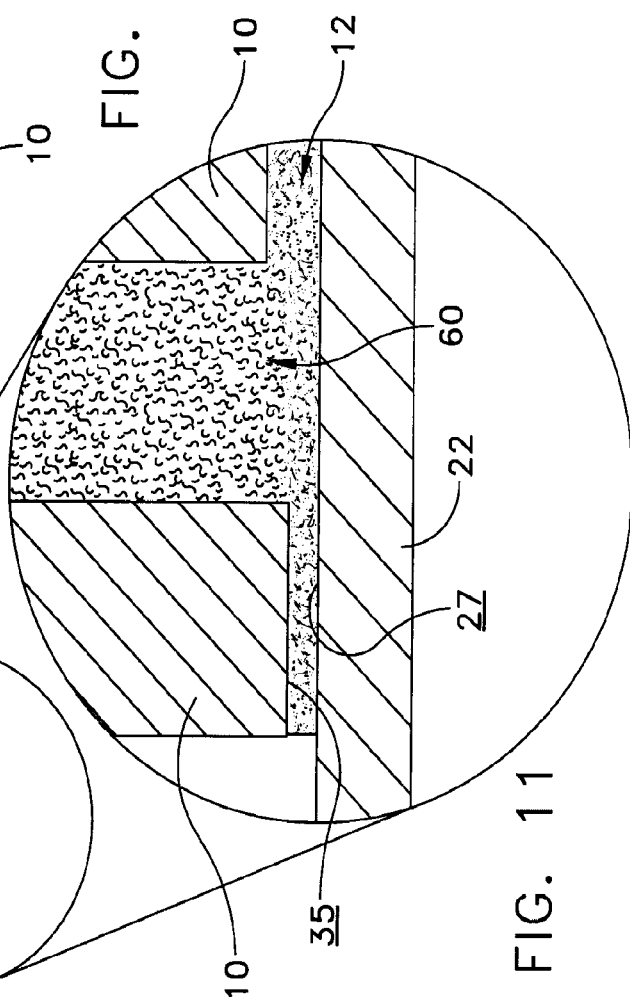
FIG. 10
FIG. 11

POROUS MEDIA COLD PLATE

CROSS-REFERENCE TO RELATED APPLICATIONS

This application claims the benefit of U.S. Provisional Application No. 60/512,736, filed Oct. 20, 2003.

FIELD OF THE INVENTION

The present invention generally relates to heat exchanging devices and more particularly, to devices adapted for removing heat from electronic circuits, systems, and the like.

BACKGROUND OF THE INVENTION

It has been suggested that a computer is a thermodynamic engine that sucks entropy out of data, turns that entropy into heat, and dumps the heat into the environment. The ability of prior art thermal management technology to get that waste heat out of semiconductor circuits and into the environment, at a reasonable cost, has limited the density and clock speeds of electronic systems.

A typical characteristic of heat transfer devices for electronic systems is that the atmosphere is the final heat sink. In heat transfer devices for electronics today, a semiconductor chip is often arranged so as to thermally contact a passive heat spreader plate, which conducts the heat from the chip to one of several types of fins. The fins, in turn, convect heat to the atmosphere with natural or forced air convection. As the power to be dissipated by semiconductor devices increases with time, a problem arises in that the thermal conductivity of the available materials becomes too low to conduct the heat from the semiconductor devices to fins with an acceptable temperature drop. The thermal power density emerging from semiconductor devices today is so high that even solid copper or silver spreader plates are not adequate.

Thermal energy can sometimes be transported by an intermediate loop of recirculating fluid. Heat from a hot object is conducted into a heat transfer fluid, the fluid is pumped by some means to a different location, where the heat is conducted out of the fluid into a convective fin and finally into the atmosphere. For example, U.S. Pat. Nos. 5,125,451 and 5,274,920, issued to Matthews, provide a microscopic laminar-flow heat exchanger for cooling a heat generating device, such as a semiconductor integrated circuit. The heat exchanger consists of a plurality of thin plates which have been laminated together to form a block. The plates consist of thin copper foil strips each having a microscopic recessed portion etched into one face of the plate. These recessed portions are chemically etched to a shallow dimension, on the order of fifty microns deep, prior to lamination. Either before or after the plates are laminated together, holes are cut through the plates at opposite sides of the recessed portions such that when the stack is laminated the holes align to form a pair of coolant distribution manifolds. Each of the manifolds is essentially a tube which penetrates into the block. The tubes are connected via the plurality of microscopic channels formed from the recessed portions during the lamination process. Selectively adjusting the thickness of the channels and the coolant flow rate allows the block to function as a heat exchanger. A semiconductor die is simply placed or bonded onto the surface of the block to effectuate heat removal.

A significant disadvantage with structures such as are taught by Matthews is the limited surface area available for coolant contact and conductive heat transfer. Additional available surface area or a more serpentine coolant flow path, if provided, would greatly enhance the heat transfer characteristics of such devices. Unfortunately, the microscopic size of Matthews' devices, and the etching techniques used to manufacture such devices, do not provide for any meaningful increase in internal surface area or complex coolant flow paths, thereby limiting the amount of thermal energy that can be removed by a single device. Furthermore, such structures do not lend themselves easily to the use of internal structures for the creation of turbulence in the coolant as it flows through the device.

Although the creation of turbulence in coolant as it flows through a thermal transfer device is a well known technique for improving heat transfer, others have found that improved thermal performance can be achieved by configuring a fluid cooling device to support laminar fluid flow. For example, in U.S. Pat. No. 6,634,421, issued to Ognibene et al., a fluid cooling device is disclosed that includes a plurality of cold plate members, each having a plurality of imperforate plate portions and perforate portions arranged in a line with at least one connector for connecting the plate portions together at one end. The cold plate members are arranged in a stack, with respective plate portions of each cold plate member being in registration with perforate portions formed in its adjacent cold plate members in the stack. The fluid cooling device appears to provide heat transfer by close clearance laminar developing flow, which may increase the thermal performance of the fluid cooling device while maintaining low pressure drop.

None of the prior art has proved to be universally appropriate for achieving efficient thermal transfer in electronics systems.

SUMMARY OF THE INVENTION

The present invention provides a heat exchanger for cooling a heat generating device including a base having a recess with a base coolant inlet opening and a base coolant outlet opening. A porous core is positioned within the recess of the base, and has a core coolant inlet opening and a core coolant outlet opening that are arranged in corresponding relation with the base coolant inlet opening and a base coolant outlet opening so as to be in fluid communication. A lid is fitted to the base so as to enclose the porous core, with a porous gasket pinched between the porous core and the lid.

In another embodiment of the invention, a heat exchanger for cooling a heat generating device is provided including a base having a recess with a coolant inlet opening and a coolant outlet opening. A complementary lid is sized so as to correspond to the size of the base, and has an inner surface with at least two fins that project outwardly from, and extend longitudinally along the inner surface in spaced apart relation to one another. Each of the fins is positioned within the recess and includes a coolant inlet opening arranged in coaxial relation with the coolant inlet opening of the base and a coolant outlet opening arranged in coaxial relation with the coolant outlet opening of the base. A porous core is positioned between the fins and within the recess, and includes a core coolant inlet opening and a core coolant outlet opening. A metal felt gasket is pinched between the porous core and the base.

In a further embodiment of the invention, a pumped, single phase heat exchanger for cooling a heat generating device is provided including a base having a recess with a coolant inlet opening and a coolant outlet opening. A lid that is complementarily sized and shaped includes a plurality of spaced-apart fins projecting outwardly from a surface and includes a porous media positioned between adjacent ones of the fins so as to form porous cores. The fins and the cores include a core coolant inlet opening and a core coolant outlet opening, and are complementarily sized so as to be received within the recess. A porous gasket is positioned within the recess and between the base and the fins and the porous media.

In yet another embodiment, a pumped, single phase heat exchanger for cooling a heat generating device is provided including a base having a peripheral wall that defines a recess. The peripheral wall also defines a first inlet opening and a first outlet opening that communicate with the recess. A lid is provided having an inner surface that includes a plurality of spaced-apart fins that project outwardly from the inner surface. The fins comprise variations in height relative to the inner surface, and at least two fins also comprise variations in length relative to others of the fins. A brazed porous media is positioned between adjacent ones of the fins so as to form a plurality of porous cores. The porous cores each comprise variations in height relative to the inner surface and the fins. The brazed porous media and the fins further define a second inlet opening and a second outlet opening. The fins and the plurality of porous cores are sized and shaped so as to be complementary with the recess, and define an inlet plenum and an outlet plenum. A porous and compressible gasket is positioned within the recess and between the base and the fins and the porous cores so as to compressibly compensate for the variations in height.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein:

FIG. 8 is a cross-sectional view of the porous media cold plate, as taken along line 8-8 in FIG. 1;

FIG. 9 is an expanded enlarged view of a portion of the porous media cold plate shown in FIG. 8;

FIGS. 10 and 11 are a cross-sectional view of a porous media cold plate formed in accordance with an alternative embodiment of the present invention, as taken along line 7-7 in FIG. 1, including an expanded enlarged view of a portion of the alternative embodiment of porous media cold plate shown in FIG. 10.

DETAILED DESCRIPTION OF THE PREFERRED EMBODIMENTS

Figure 1:
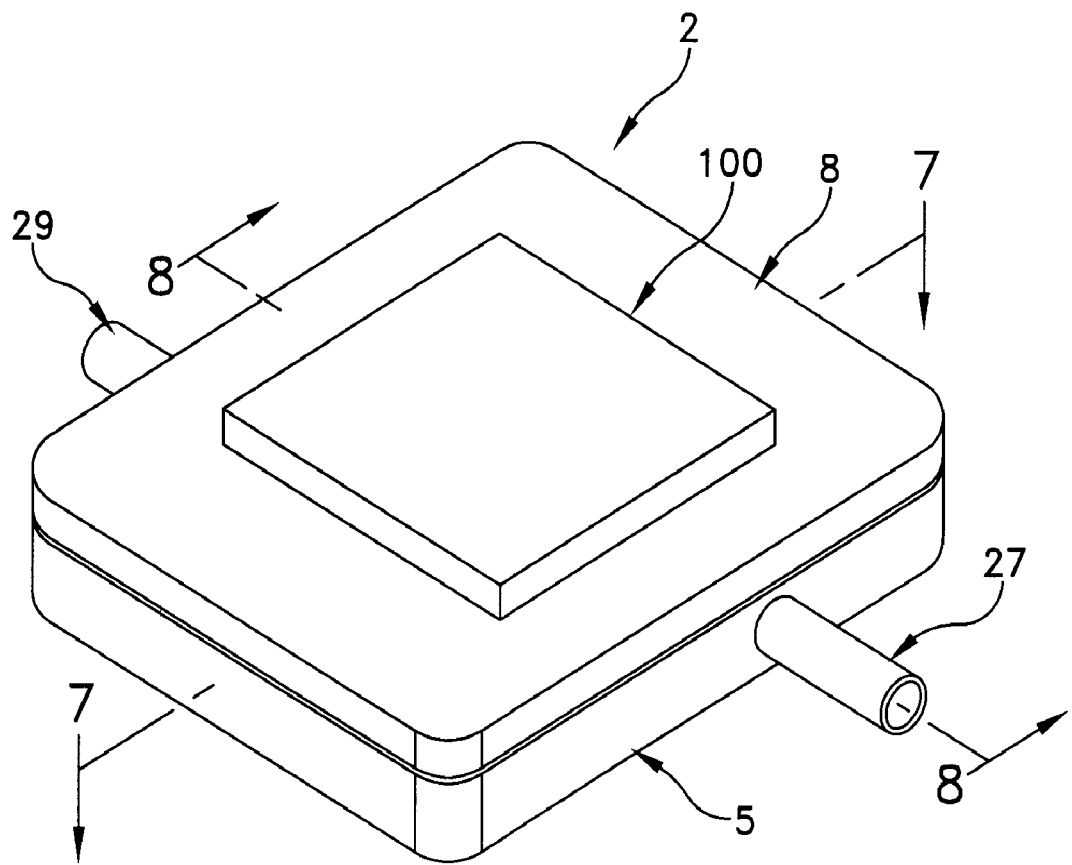
FIG. 1 is a perspective view of a porous media cold plate formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 2:
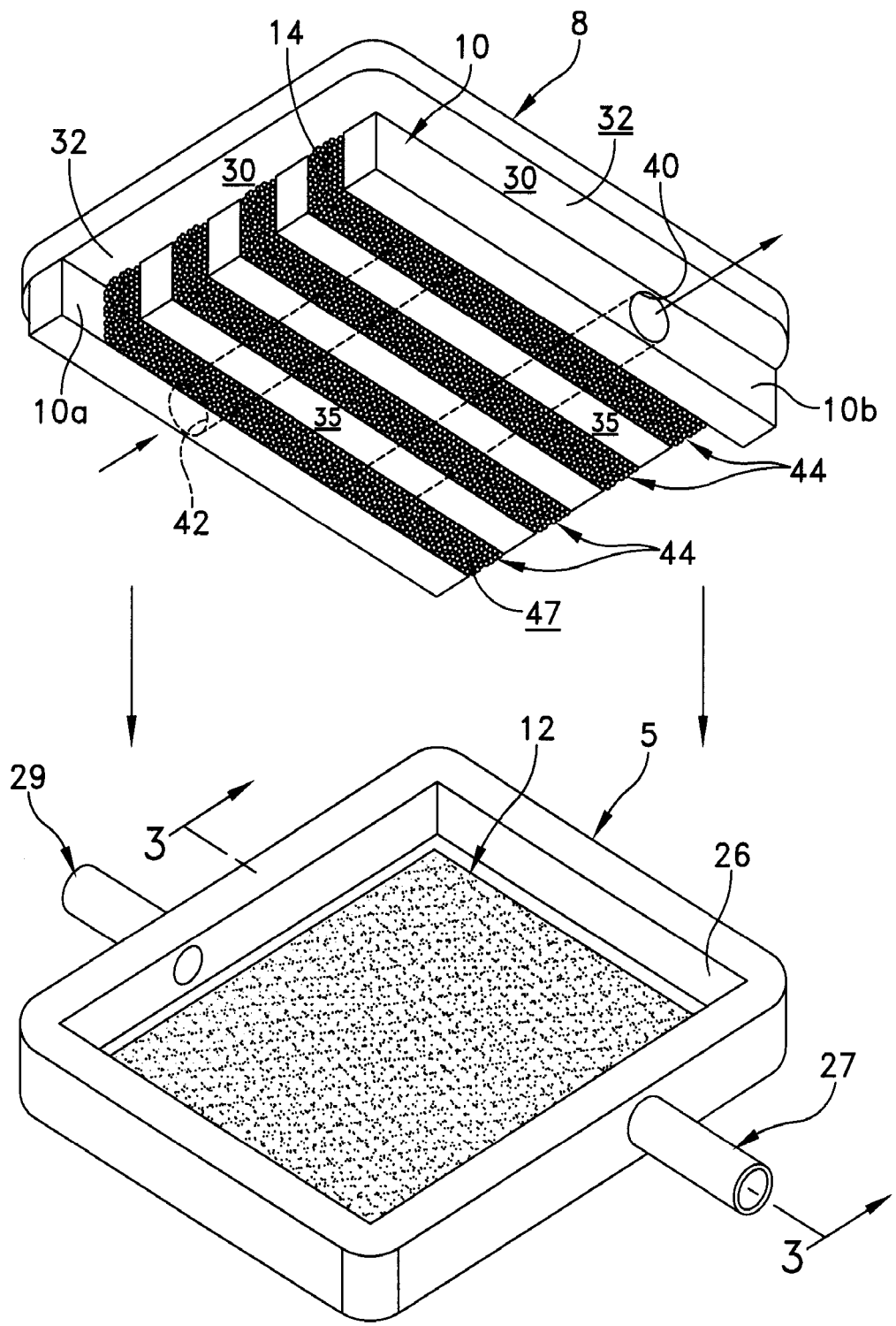
FIG. 2 is an exploded perspective view of the porous media cold plate shown in FIG. 1.
Figure 3:
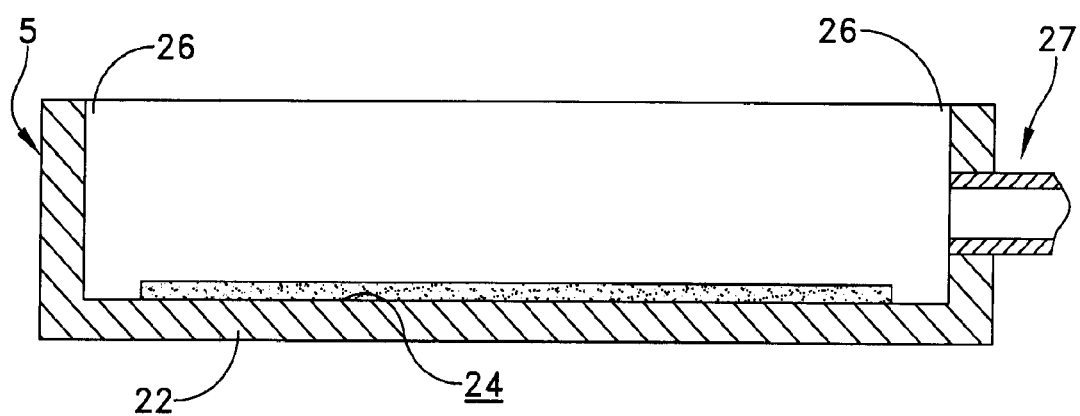
FIG. 3 is a cross-sectional plan view of a base, as taken along line 3-3 in FIG. 2.
Figure 4:
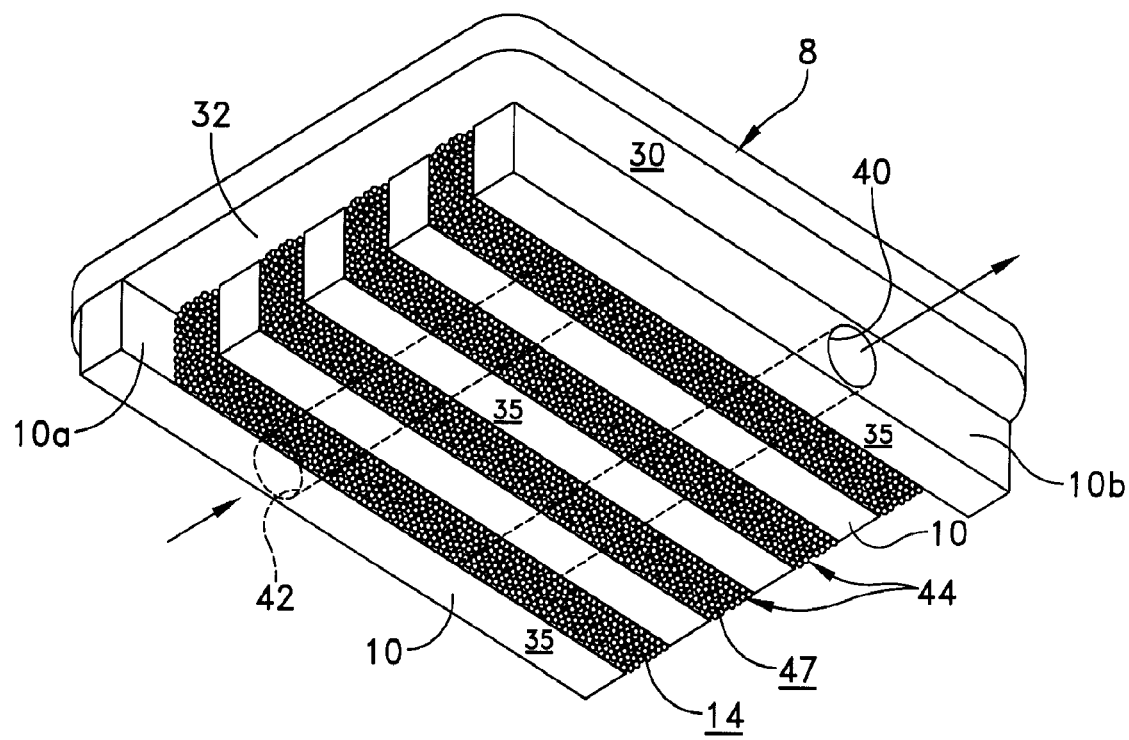
FIG. 4 is a perspective view of a lid portion of a porous media cold plate formed in accordance with the present invention.
Figure 5:
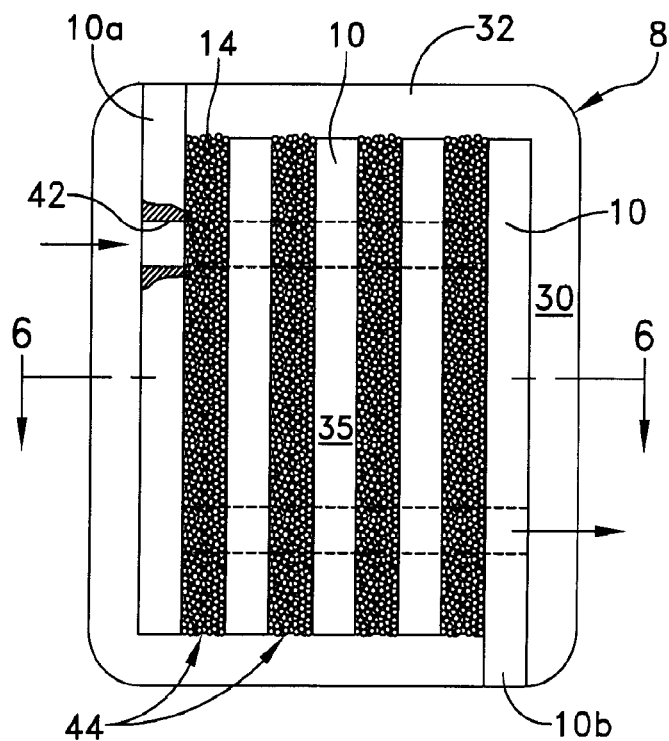
FIG. 5 is a bottom plan view of the lid shown in FIG. 4.
Figure 6:
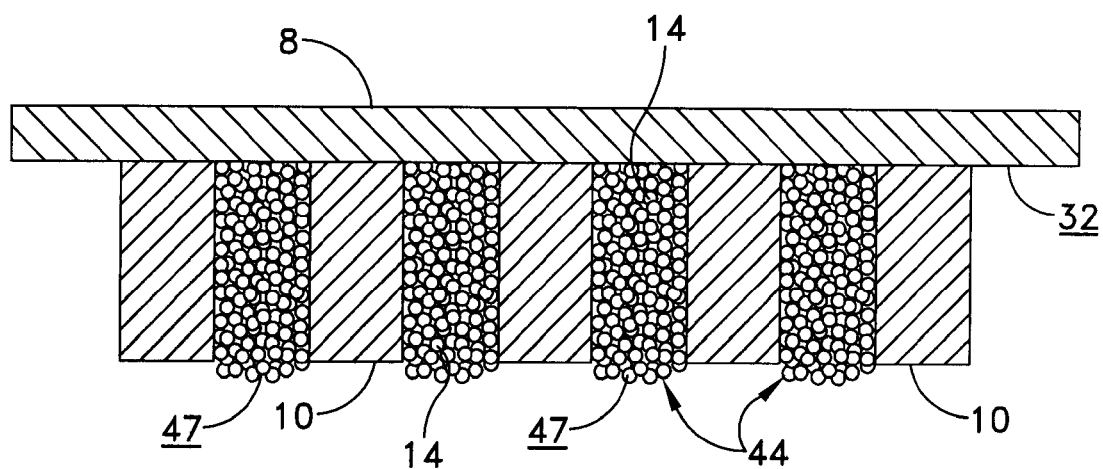
FIG. 6 is a cross-sectional view of the lid shown in FIGS. 4 and 5, as taken along line 6-6 in FIG. 5.

Referring to FIGS. 1-3, a porous media cold plate 2 formed in accordance with the present invention includes a base 5, a lid 8, two or more plate fins 10, a gasket 12, and a porous media 14. More particularly, base 5 is often formed as a rectilinear enclosure having a bottom wall 22 comprising a substantially uniform thickness of a thermally conductive material, e.g., copper, steel, aluminum, or any of their respective alloys. Bottom wall 22 preferably comprises a substantially planer inner surface 24 and a peripheral edge wall 26. Peripheral edge wall 26 projects outwardly from the peripheral edge of inner surface 24 so as to circumscribe inner surface 24, thus defining a recessed region. An inlet conduit 27 and an outlet conduit 29 are defined through portions of peripheral edge wall 26 or, through bottom wall 22 or lid 8, and are arranged in fluid flow communication with one another. Gasket 12 is positioned atop inner surface 24 of base 5, and preferably comprises a metal felt or metal wool. Although nonmetal porous gaskets may also be used with the present invention, they are not preferred. Advantageously, a metal felt or wool gasket 12 is both porous and compressible and is also easily susceptible to brazing. This allows for brazed attachment and little or no thermal expansion mismatches when positioned within base 5.

Lid 8 is sized so as to correspond to the size of base 5, and comprises a substantially planar plate of thermally conductive material having an inner surface 30 and a peripheral edge surface 32. Two or more plate fins 10 project outwardly from, and extend longitudinally along the length of inner surface 30 in spaced apart relation to one another. In one embodiment of the invention, outer most plate fins 10a and 10b are longer at one end so as to define an inlet plenum 33 and an outlet plenum 34 (FIG. 7) when lid 8 is assembled to base 5, as will hereinafter be disclosed in further detail. Each plate fin 10 includes an elongate top surface 35. It is very often the case that plate fins 10 comprise a height above inner surface 30 that varies from fin to fin due to normal dimensional tolerance variations (FIG. 9). A plurality of coaxial inlet openings 40 and coaxial outlet openings 42 are formed through several of plate fins 10. Of course, plate fins 10 may be positioned on inner surface 24 of base 5 with adequate results.

In one embodiment, porous media 14 is located on inner surface 30 and between adjacent plate fins 10 so as to form a plurality of heat transfer columns or cores 44 that comprise a plurality of particles 45. Plurality of particles 45 are often combined with a filler metal or combination of metals that is often referred to as a "braze" or brazing compound, or even a solder. The porous media acts to provide for enhanced thermal communication between plate fins 10 and a coolant fluid flowing through porous media cold plate 2 (FIG. 7) by effectively extending the surface area of the fins. It will be understood that "brazing" is the joining of metals through the use of heat and a filler metal, i.e., a brazing compound. Of course, a solder having comparable attributes may also be used with adequate results. A typical brazing compound of the type used in the construction of the present invention very often comprises a melting temperature that is above 450° C.-1000° C., but below the melting point of particles 45 that are being joined to form porous media 14. Each core 44 of brazed particles 45 define an elongate, uneven top surface 47 that is substantially coextensive with top surface 35 of each plate fin 10. Of course, cores 44 may also be formed from a variety of porous media 60, e.g., open cell foam, felt, wool, screen, or chopped wire (FIGS. 10 and 11). All of these porous media may be made from either metals or non-metals, and may be bonded to join them to a wall through which heat is transferred—this is important for using the additional surface area for heat transfer to a coolant fluid.

Particles 45 are very often formed from a conductive metal, e.g., copper, but may be selected from any of the materials having high thermal conductivity, that are suitable for fabrication into brazed porous structures, e.g., carbon, tungsten, copper, aluminum, magnesium, nickel, gold, silver, aluminum oxide, beryllium oxide, or the like, and may comprise either substantially spherical, oblate or prolate spheroids, and less preferably, arbitrary or regular polygonal, or filament-shaped particles of varying cross-sectional shape. For example, when particles 45 are formed from copper spheres or spheroids (FIG. 9) whose melting point is about 1981° F./1083° C., the overall processing temperature for porous media 14 will be about 1000° C.

In general, to form porous media 14 according to the present invention, a plurality of particles 45 and a suitable brazing compound, e.g., one containing about thirty-five percent gold and about sixty-five percent copper, are heated together to a brazing temperature that melts the brazing compound, but does not melt plurality of particles 45. Significantly, during brazing, particles 45 are not fused together as with sintering, but instead are joined together by creating a metallurgical bond between the brazing compound and the surfaces of adjacent particles 45 through the creation of fillets of re-solidified brazing compound. Thus, as the brazing compound liquefies, the molecules of molten brazing metals attract one another as the surface tension between the molten braze and the surfaces of individual particles 45 tend to draw the molten braze toward each location where adjacent particles 45 are in contact with one another. Fillets are formed at each such location as the molten braze metals re-solidify. The resulting structure of each core 44 provides a porous labyrinth through which coolant fluid may flow and thereby experience increased heat transfer (FIGS. 7-10).

Figure 12:
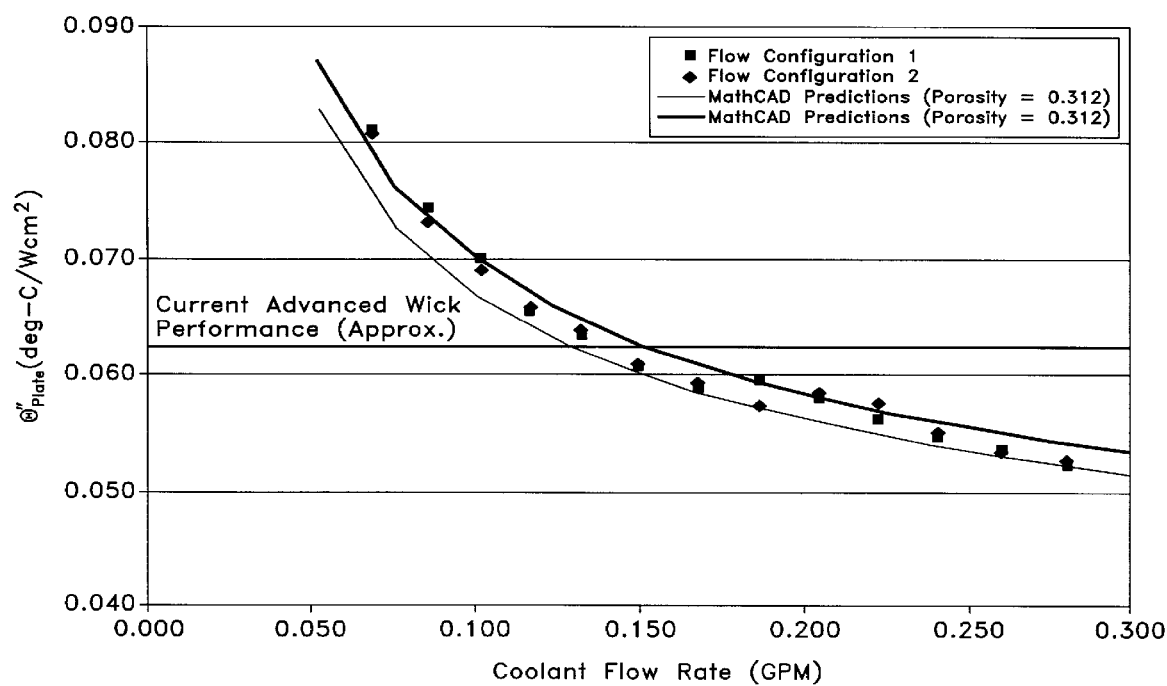
FIGS. 12 and 13 are graphical illustrations of the thermal performance of the present invention in comparison to prior art cold plates.
Figure 13:
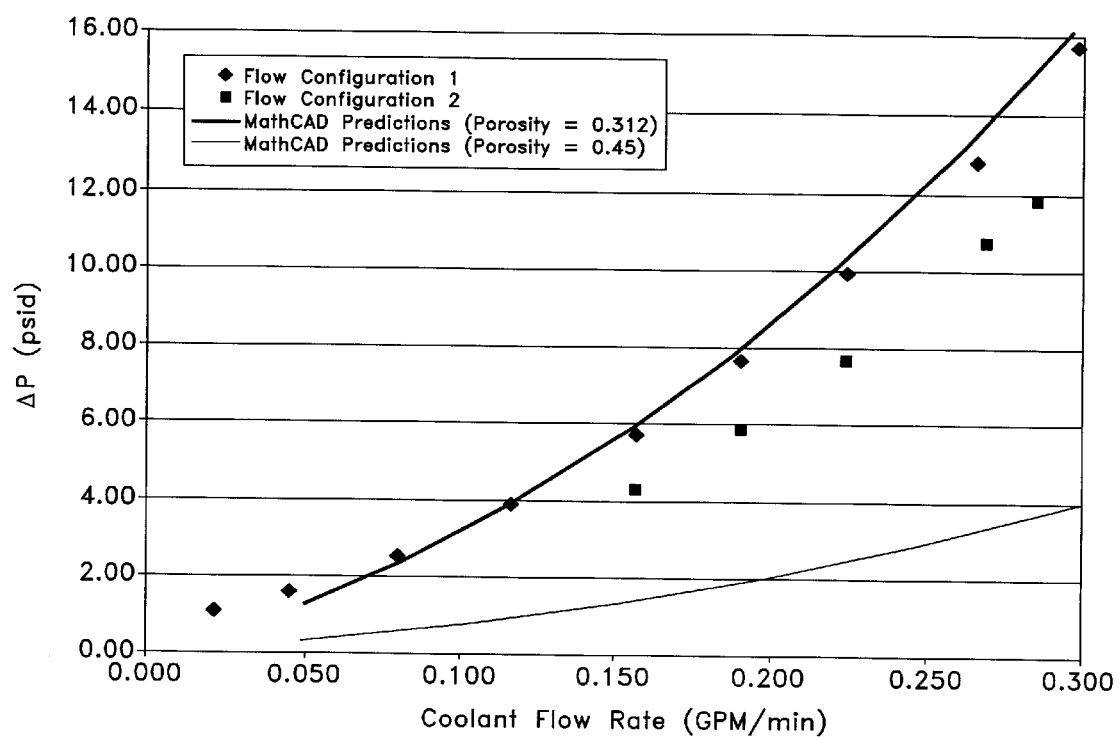

The enhanced thermal conductivity of porous media 14 directly improves the thermal conductance of the heat transfer device in which it is formed. Depending upon the regime of heat flux that porous media cold plate 2 is subjected to, the thermal conductance of brazed porous media 14 has been found to increase as shown in FIG. 12, and FIG. 13 represents hydraulic performance.

Referring to FIGS. 1 and 2, a porous media cold plate 2 may be formed in accordance with the present invention by brazing a plurality of particles 45 within the spaces between adjacent plate fins 10 on inner surface 30 of lid 8. It will be noted that after brazing, top surface 47 of each column of brazed particles 45 is uneven with each having a dissimilar height above inner surface 30 of lid 8 (FIG. 9). In addition, top surface 35 of each plate fin 10 will have a slightly different height above inner surface 30 of lid 8 with respect to one another and, also with respect to top surface 47 of each core 44.

Figure 7:
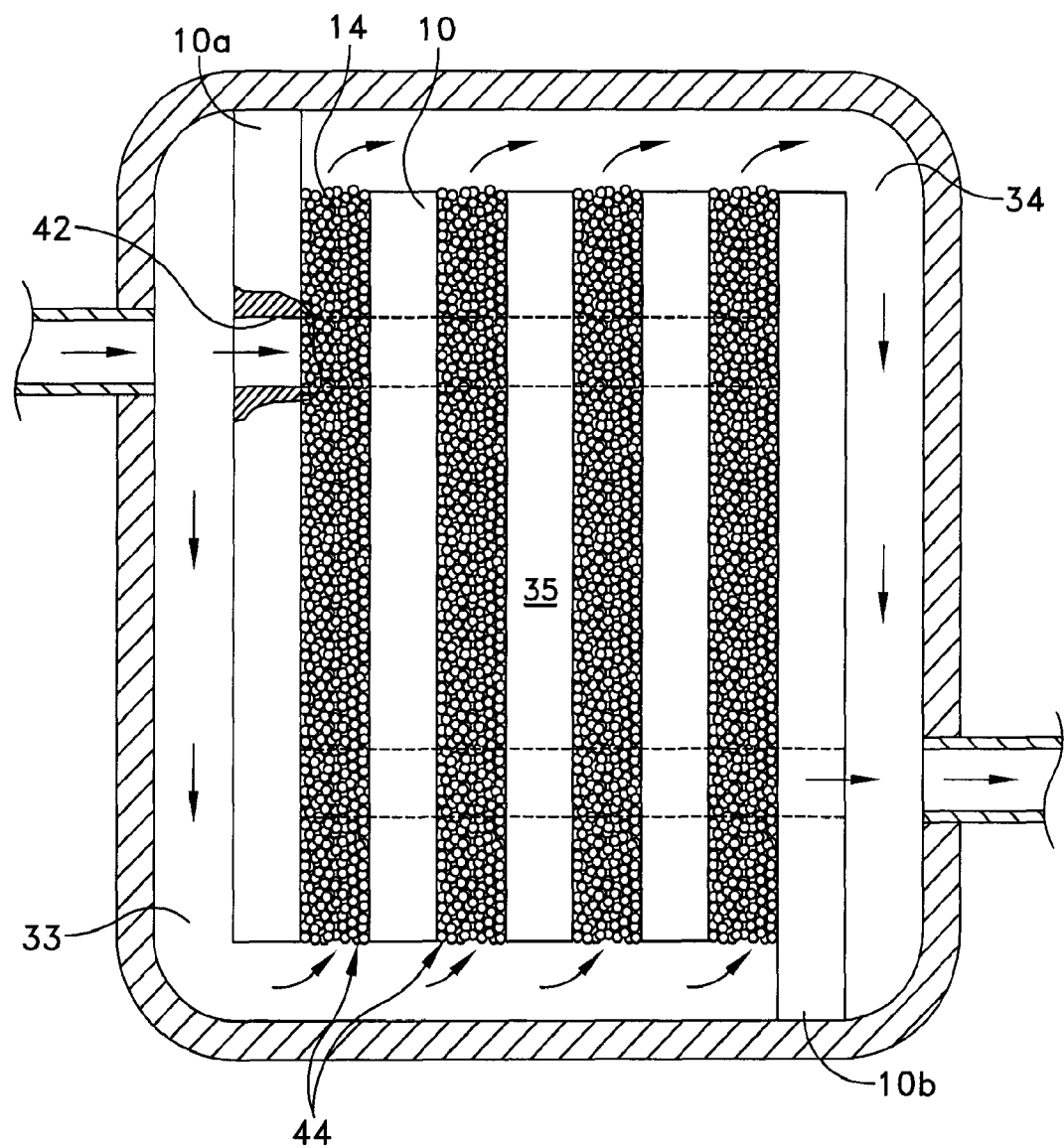
FIG. 7 is a cross-sectional view, not to scale, of a porous media cold plate formed in accordance with the present invention, as taken along line 7-7 in FIG. 1, showing a schematic representation of a typical coolant flow pattern.

With particles 45 brazed in cores 44 between adjacent plate fins 10, lid 8 is positioned above base 5 so that peripheral edge surface 32 is arranged in spaced confronting relation to the top surface of peripheral edge wall 26 of base 5. Once in this position, lid 8 is moved toward base 5 until brazed particles 45 and plate fins 10 engage metal felt gasket 12 located on inner surface 24 of base 5. As this occurs, inlet openings 40 are located in substantially aligned, often coaxial relation with inlet conduit 27 and outlet openings 42 are arranged in aligned coaxial relation with outlet conduit 29. Also, an end of each plate fin 10a and 10b is located adjacent to a portion of peripheral edge wall 26 so as to stop coolant flow and thereby define inlet plenum 33 and outlet plenum 34 when lid 8 is assembled to base 5. Advantageously, inlet plenum 33 and outlet plenum 34 are sized and shaped so that coolant fluid entering porous media cold plate 2 via inlet conduit 27 suffers little decrease or increase in velocity, i.e., the cross-sectional area of inlet plenum 33 and outlet plenum 34 is often approximately equal to the cross-sectional area of inlet opening 27 and outlet opening 42 (FIG. 7). Lid 8 is then brazed or welded to base 5 along the interface between the top surface of peripheral edge wall 26 and peripheral edge surface 32. At the same time, top surfaces 35 of plate fins 10 and top surfaces 47 of cores 44 engage and compress metal felt gasket 12 so that metal felt gasket 12 is pinched between these two structures. It is often the case that gasket 12 comprises a more coarser porosity than porous media 14 or porous media 60 so as to enhance compression and provide for some fluid flow when compressed by cores 44 and fins 10.

During the brazing operation, plate fins 10 and cores 44 are brazed to metal felt gasket 12. It will be understood that a metal felt gasket may also be adhered to base 5 via solder or even thermal epoxy. Advantageously, the dimensional mismatch and unevenness between top surfaces 35 and 47 are fully compensated by the compressibility of metal felt gasket 12 while still allowing some fluid flow through the gasket. In addition, metal felt gasket 12 may be evenly brazed to both top surface 35 and top surface 47, but due to its porosity, allows for residual brazed materials and other bi-products to be flushed from each core 44 so as to further enhance their fluid flow characteristics and therefore heat transfer capability. It should be noted that gasket 12 starts out more porous, but after compression is less porous. It is desirable that gasket 12 eliminate, or at least limit leakage flow between fins 10 and lid 8.

In operation, a coolant fluid is pumped through inlet conduit 27 and thereby into inlet plenum 33 and plurality of inlet openings 40 so as to flood each core 44. A portion of the coolant fluid also floods inlet plenum 33 that surrounds the inlet portions of plate fins 10 and cores 44 (FIG. 7). As the coolant fluid moves through porous media 14 of core 44, heat is transferred to the fluid. The coolant fluid exits porous media cold plate 2 through outlet openings 42, outlet plenum 34, and outlet conduit 29. By flowing single-phase coolant fluid through porous media 14, high effective heat transfer rates can be achieved at comparatively low temperature differences. In order to mitigate any pressure differential required to drive the single phase coolant fluid through porous media 14, inlet plenum 33 and outlet plenum 34 provide a scheme which reduces the coolant mass flux and effective flow length. Cores 44 manifold the flow in such a way that the total cold plate mass flow is subdivided into three streams, each of which flows through a segment of porous media 14 that is slightly less than one third of the total length of core 44. Cores 44 are bonded into base 5 which directs the flow of coolant fluid to and from cores 44. Mounting features may be provided for attaching cores 44, via an outer surface of lid 8, to a heat-generating device, e.g., a semiconductor device 100.

It is to be understood that the present invention is by no means limited only to the particular constructions herein disclosed and shown in the drawings, but also comprises any modifications or equivalents within the scope of the claims.

What is claimed is:

1. A heat exchanger for cooling a heat generating device comprising:
   a base having a recess;
   a porous core positioned within the recess;
   a first coolant inlet opening positioned within the interior of the heat exchanger;
   a second coolant inlet opening positioned within the interior of the heat exchanger and spaced a distance from the first coolant inlet opening;
   a coolant outlet opening disposed within the heat exchanger, wherein a first coolant flow path extends between the first coolant inlet opening and the coolant outlet opening, and a second coolant flow path extends between the second coolant inlet opening and the coolant outlet opening;
   a lid fitted to said base and enclosing said porous core; and
   a plurality of fins extending between the base and the lid, wherein the first and second coolant flow paths pass between at least two of the plurality of the fins and the first coolant inlet opening extends through one of the plurality of fins and the coolant outlet opening extends through another of the plurality of fins,
   wherein a porous gasket is disposed between said porous core and said lid, said porous gasket being brazed to said base.

2. The heat exchanger of claim 1, wherein said porous core is positioned adjacent to said fins.

3. The heat exchanger of claim 1, wherein the plurality of fins are attached to the lid.

4. The heat exchanger of claim 1, wherein said porous core is located on an inner surface of the lid and at least a portion of said porous core is located between adjacent fins so as to form a plurality of heat transfer cores.

5. A heat exchanger for cooling a heat generating device comprising:
   a base having a recess;
   a lid fitted to the base;
   an inlet plenum and an outlet plenum within the base and lid;
   a porous core positioned within the recess between the inlet and outlet plenums, and enclosed between the base and the lid;
   a first coolant flow path defining a first flow path length extending to and between the inlet and outlet plenums;
   a second coolant flow path defining a second flow path length extending to and between the inlet and outlet plenums, wherein the second flow path length is shorter than the first flow path length; and
   a plurality of fins disposed between the base and the lid, wherein at least one of the first and second coolant flow paths extends through at least one of the plurality of the fins,
   wherein a porous gasket is disposed between said porous core and said lid, said gasket comprising at least one of felt and metal wool.

6. The heat exchanger of claim 5, wherein the first and second coolant flow paths pass between at least two of the fins.

7. The heat exchanger of claim 6, wherein said porous core is positioned adjacent to said fins.

8. The heat exchanger of claim 6, wherein the plurality of fins are attached to the lid.

9. The heat exchanger of claim 6, wherein said porous core is located on an inner surface of the lid and at least a portion of said porous core is located between adjacent fins so as to form a plurality of heat transfer cores.

10. A heat exchanger comprising:
    a closed vessel;
    a coolant inlet opening located at a first location on the vessel;
    a coolant outlet opening located at a second location on the vessel and spaced away from the first location;
    a plurality of fins disposed in an interior of the vessel;
    a porous core disposed in the interior of the vessel and between at least two of the plurality of the fins; and
    a first coolant path extending between the coolant inlet opening and the coolant outlet opening and through at least one of the plurality of fins; and
    a second coolant path extending between the coolant inlet opening and the coolant outlet opening and around an end of at least one of the plurality of fins.

11. The heat exchanger of claim 10, further comprising a third coolant path extending at least partially along a path between two of the plurality of fins.

12. The heat exchanger of claim 10, wherein the closed vessel comprises a base and a lid to cover the base.

13. A heat exchanger comprising:
    a closed vessel;
    a porous core positioned within an interior of the closed vessel;
    a coolant inlet plenum;
    a coolant outlet plenum;
    a plurality of fins disposed within the interior of the closed vessel;
    a first coolant inlet opening in one of the plurality of fins defining a first coolant flow path from the coolant inlet plenum through the one of the plurality of the fins,
    a first coolant outlet opening positioned within the interior of the closed vessel defining a second coolant flow path extending from within the one of the plurality of fins into the outlet plenum; and
    a second coolant outlet opening positioned within the interior of the closed vessel and defining a third coolant flow path extending from between two of the plurality of fins to the outlet plenum.

* * * * *